United States Patent
Hwang et al.

(10) Patent No.: US 6,333,242 B1
(45) Date of Patent: Dec. 25, 2001

(54) METHOD OF FABRICATING SEMICONDUCTOR DEVICE WITHOUT HAVING GROOVES AT EDGE PORTIONS OF STI

(75) Inventors: Sung-Man Hwang, Yongin; Hyung-Moo Park, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/522,944

(22) Filed: Mar. 10, 2000

(30) Foreign Application Priority Data

Oct. 18, 1999 (KR) .................................................. 99-45013

(51) Int. Cl.$^7$ .................................................. H01L 21/76
(52) U.S. Cl. .................. 438/435; 438/424; 438/425; 438/436; 438/437; 438/438
(58) Field of Search .................... 438/424, 435, 438/436, 437, 438

(56) References Cited

U.S. PATENT DOCUMENTS

| | | | |
|---|---|---|---|
| 5,177,028 | * | 1/1993 | Manning . |
| 5,395,790 | * | 3/1995 | Lur . |
| 5,994,201 | * | 11/1999 | Lee ........................................ 438/427 |
| 6,001,706 | * | 12/1999 | Tan et al. .............................. 438/424 |
| 6,069,056 | * | 5/2000 | Son et al. .............................. 438/424 |

* cited by examiner

*Primary Examiner*—Long Pham
(74) *Attorney, Agent, or Firm*—The Law Offices of Eugene M. Lee, PLLC

(57) ABSTRACT

A method for fabricating a semiconductor device and a semiconductor formed by this method, the method including, the steps of sequentially forming a pad oxide film, a polysilicon film, and an antioxidation film on an active region of a semiconductor substrate such that a field region is exposed; etching an exposed portion of the surface of the substrate to a predetermined thickness to form a trench within the substrate; forming a first insulation film along the inner face of the trench by using an oxidation process; forming a stress buffer film on the entire surface of the resultant structure; forming a second insulation film on the stress buffer film such that the trench is sufficiently filled; making the second insulation film planar such that the remaining antioxidation film has a predetermined thickness on the active region of the substrate so as to form a shallow trench isolation within the trench; and sequentially removing the remaining antioxidation film, the polysilicon film, and the pad oxide film.

9 Claims, 6 Drawing Sheets

METHOD OF FABRICATING SEMICONDUCTOR DEVICE WITHOUT HAVING GROOVES AT EDGE PORTIONS OF STI

BACKGROUND OF THE INVENTION

1. Field of the Invention

The present invention relates to a semiconductor device. More particularly, the present invention relates to a method for fabricating a semiconductor device which is capable of preventing grooves from developing at an edge portion of the semiconductor device when using shallow trench isolation technology and thereby prevent the degradation of operational characteristics of a transistor.

2. Description of the Background Art

As semiconductor devices are becoming more highly integrated, a fine pattern is required to fabricate the device, and accordingly, a channel length of a transistor and a width of a field oxide film for element isolation are reduced. Thus, various techniques for element isolation have been proposed such as a LOCOS method, a modified LOCOS method, or a trench isolation method.

When the LOCOS method is used, the size of an active region is reduced due to an occurrence of a bird's beak phenomenon of an oxide film that grows extended over the active region during a thermal oxidation process. This makes it difficult to adjust the thickness of a gate oxide film. Thus, the LOCOS method has restricted application.

For this reason, instead of adopting the LOCOS process, the trench isolation ("TI") method is widely used. In the TI method, a silicon substrate is partly etched to form a trench on which an insulation film (i.e., an oxide film) is deposited. Then, the insulation film overlying the active region is etched by using an etch back process or a chemical mechanical polishing method so that the insulation film remains only in a field region.

FIGS. 1 through 6 illustrate a known process of a TI method for isolating a semiconductor device.

FIG. 1 depicts pad oxide film 12 formed of a thermal oxide film material and antioxidation film 14 formed of an SiN material. These two films are sequentially formed on semiconductor device, i.e., a silicon substrate 10.

As shown in FIG. 2, a photoresist film pattern (not shown) is formed on antioxidation film 14 in a manner such that the surface of a portion of antioxidation film 14 can be used as a field region. By using the photoresist film pattern as a mask, antioxidation film 14 and pad oxide film 12 are sequentially etched. Then, the photoresist film pattern is removed so that only antioxidation film 14 and pad oxide film 12 remain on the active region where an active device is to be formed. Subsequently, by using the etched antioxidation film 14 as a mask, the exposed portion of substrate surface 10 is etched to a predetermined thickness to thereby form a trench t.

According to FIG. 3, first insulation film 16 formed of a thermal oxide film material is deposited along the internal interface of trench t. The reason why the first insulation film 16 is formed inside trench t is to compensate for any damage on the etched surface of silicon substrate 10, which may be possibly caused during the etching process.

Successively, stress buffer film 18, made of an SiN material ("nitride film liner"), is formed on the entire surface of the resulting structure, and second insulation film 20, made of a USG material, is formed on stress buffer film 18 including trench t, sufficiently filling the trench.

As shown in FIG. 4, the second insulation film 20 is CMP ("chemical and mechanical polishing") processed to leave antioxidation film 14 with a predetermined thickness on the active region, thereby making the entire substrate planar. During this process, stress buffer film 18 is also partly etched.

FIGS. 5 and 5A illustrate antioxidation film 14 on the active region being removed by using an isotropic etching process, during which stress buffer film 18, at the upper end portion of the second insulation film 20, is also partly etched forming groove g1.

FIGS. 6 and 6A show pad oxide film 12 of the active region being removed by a wet etching method, forming a shallow trench isolation ("STI") consisting of stress buffer film 18 and first and second insulation layers 16 and 20. Further, after a buffer oxide film (not shown) is formed on the active region of the substrate 10, an ion implantation process for forming a well and an ion implantation process for controlling a threshold voltage Vth are performed, and then the buffer oxide film is removed, thereby completing the element isolation process.

Since second insulation film 20 of the field region is also partly etched to form groove g2 during the process of removing pad oxide film 12 and the buffer oxide film, the element isolation process is completed, and the step coverage of the STI is at a level almost the same as that of the active region. However, the STI formed according to the above method has the following problems relating to the fabrication of the device. Since the buffer film 18 inside the trench t is also partly etched during the process of removing antioxidation film 14, groove g1, having a concave shape, is undesirably formed between first insulation film 16 and the second insulation film 20 both forming the STI in the vicinity of the interface of the active region and the field region. Moreover, the groove g1 becomes larger during the process of removing the pad oxide film 12. FIGS. 5A and 6A show an enlarged view of the portions I and II in FIGS. 5 and 6, respectively, where the grooves g1 and g2 are formed.

When a transistor is formed as a gate electrode substance by deposition at the portion where the grooves g1 and g2 are formed, an electric field is concentrated on that part where the grooves are formed when the device is driven, thus causing the gate oxide film to be degraded. In a worst case scenario, a hump phenomenon occurs in which the transistor appears to have two threshold voltages Vth, resulting in deteriorated characteristics of the transistor.

SUMMARY OF THE INVENTION

Accordingly, the present invention provides a method for fabricating a semiconductor device by which a polysilicon film in a dual structure (doped polysilicon film/undoped polysilicon film, each with a different oxidation rate) is formed between an antioxidation film and a pad oxide film in forming a shallow trench isolation ("STI"), thereby essentially restraining the occurrence of grooves at an edge portion of the STI. Furthermore, the present method has the feature of preventing degradation of operational characteristics of a transistor due to a concentration of an electric field caused when the transistor is driven and a hump phenomena occurs.

To achieve these and other features, the present invention is dissected to a method for fabricating a semiconductor device, preferably including the steps of sequentially forming a pad oxide film, a polysilicon film, and an antioxidation film on an active region of a semiconductor substrate in a manner so that a field region is exposed; etching an exposed portion of the surface of the substrate to a predetermined thickness to form a trench within the substrate; forming a first insulation film along the inner face of the trench by using an oxidation process; forming a stress buffer film on the entire surface of the resulting structure; forming a second insulation film on the stress buffer film in a manner so that the trench is substantially filled; forming into a plane the second insulation film in a manner so that the antioxidation film retains a predetermined thickness on the active region of the substrate, thus forming an STI within the trench; and sequentially removing the remaining antioxidation film, the polysilicon film and the pad oxide film.

The polysilicon film is formed of a dual structure having a doped polysilicon film and undoped polysilicon film. A wet etching method using $NH_4OH$ as an etchant removes the polysilicon film. In the case where a shallow trench isolation is formed by using the above method, the stress buffer film (also called a nitride film liner) is also partly etched during the process of removing the antioxidation film remaining in the active region. However, since the polysilicon film has a dual structure and the first insulation film formed as part of the polysilicon film underlies the antioxidation film so that the height of the antioxidation film is as high as the corresponding thickness, etching is not extended to include the stress buffer film formed on the inner side wall of the trench. Consequently, grooves are prevented from occurring at the edge portion of the STI and degradation of operational characteristics of a transistor is prevented.

BRIEF DESCRIPTION OF THE DRAWINGS

These and other aspects, features and advantages of the present invention will become apparent to one skilled in the art to which the present invention pertains through a study of the following detailed description in conjunction with the appended drawings, all of which form a part of this specification, wherein.

DETAILED DESCRIPTION OF THE PRESENTLY PREFERRED EXEMPLARY EMBODIMENTS

Korean patent application number 99-45013, filed on Oct. 18, 1999, and entitled: "METHOD FOR FABRICATING SEMICONDUCTOR DEVICE," is incorporated by reference herein in its entirety.

Preferred embodiments of the present invention will be discussed hereinbelow with reference to FIGS. 7–12, which illustrate examples of the present invention.

FIGS. 7 through 12 show the sequential order of the preferred method for isolating a semiconductor device in accordance with the present invention, which will now be described.

Figure 1:
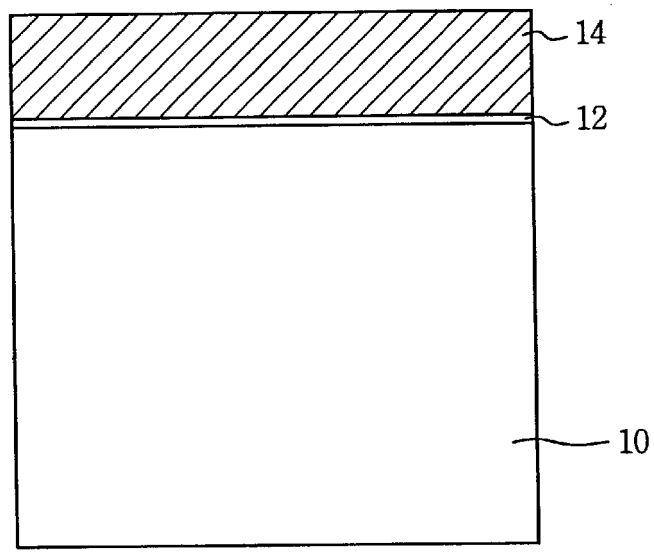
FIGS. 1 through 6A show the sequential order of a known process for isolating a semiconductor device.
Figure 2:
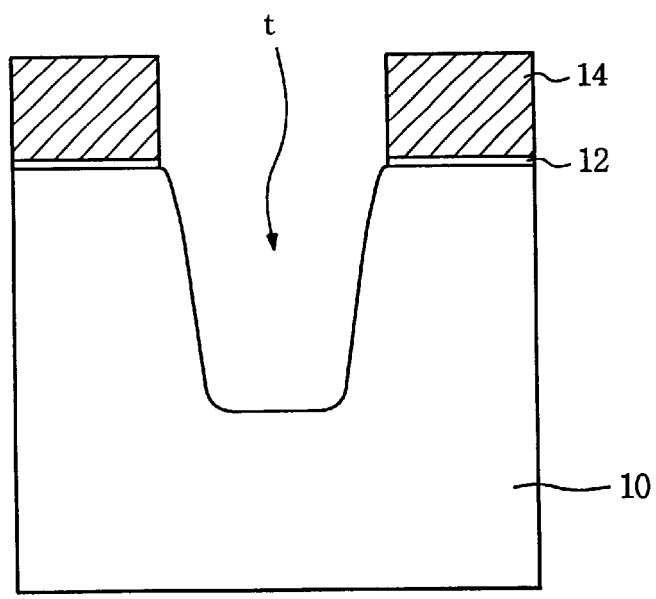
Figure 3:
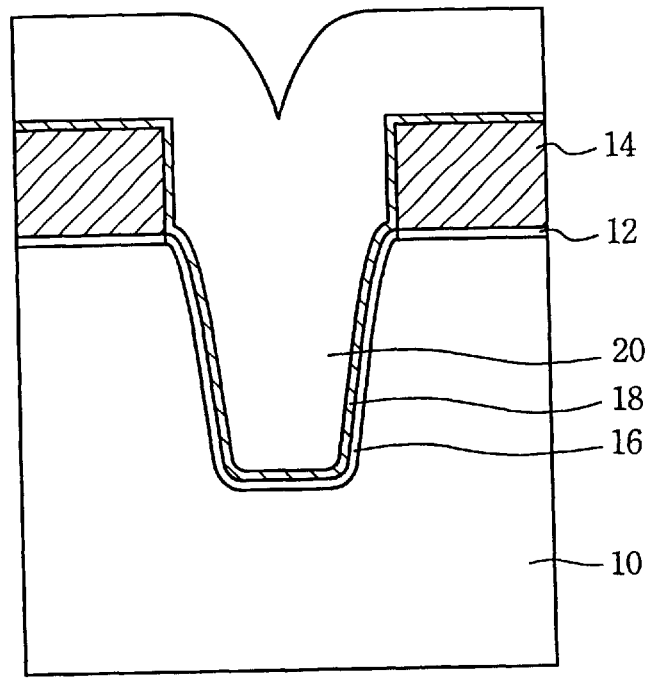
Figure 4:
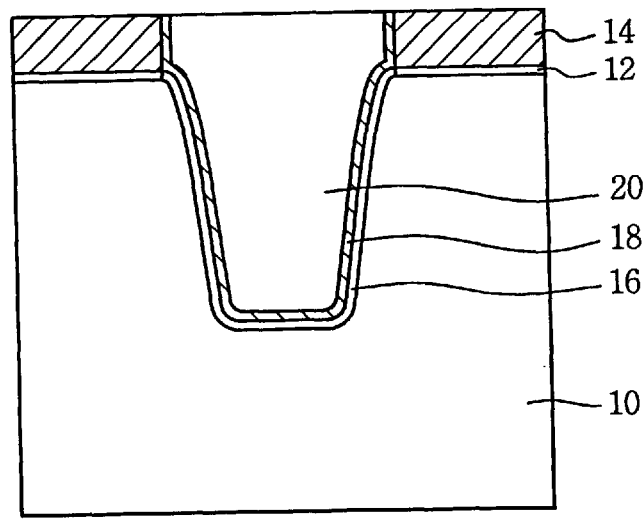
Figure 5:
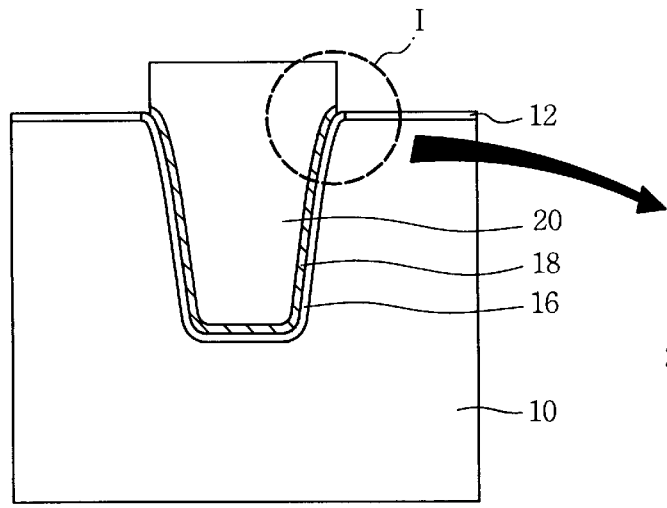
Figure 5A:
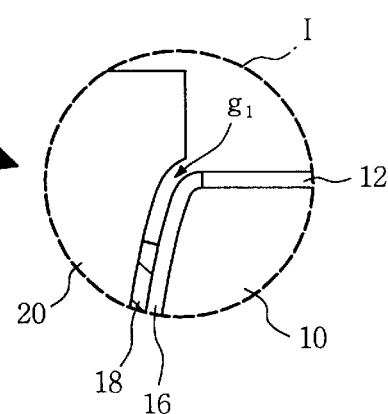
Figure 6:
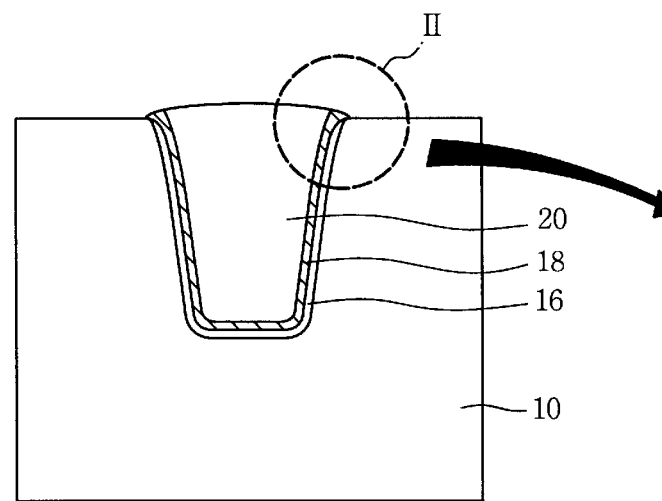
Figure 6A:
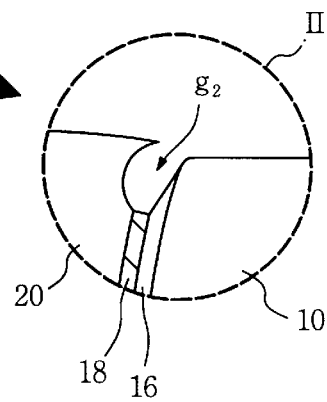
Figure 7:
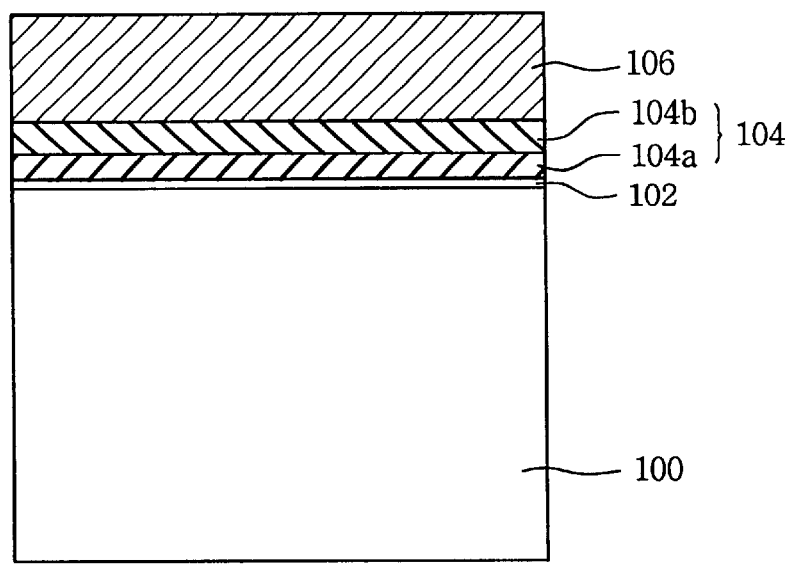
FIGS. 7 through 12 show the sequential order of a preferred process for isolating a semiconductor device in accordance with the present invention.

FIG. 7 illustrates pad oxide film 102 made of a thermal oxide film material formed on semiconductor substrate 100 (i.e., a silicon substrate). Polysilicon film 104, having a dual structure of doped polysilicon film 104a and undoped polysilicon film 104b, is formed on film 102. Antioxidation film 106 made of a nitride film material is formed on polysilicon film 104. Doped polysilicon film 104a and undoped polysilicon film 104b are formed with a thickness between about 300~700 Å, while antioxidation film 106 is formed with a thickness between about 1000~2000 Å.

In the preferred embodiment of the present invention, antioxidation film 106 is formed having a single layer structure of SiN, but the antioxidation film may have a stacked film structure where a nitride film in the oxide film line, that is, SiON, is formed on the SiN. The reason for forming the polysilicon film 104 in the dual structure between the pad oxide film 102 and the antioxidation film 106 is to prevent grooves from occurring at both edge portions of the STI on the interface of the active region and the field region by sufficiently raising the level of the groove toward the upper end of the trench, rather than in the inner side wall of the trench, in the follow-up process.

Figure 8:
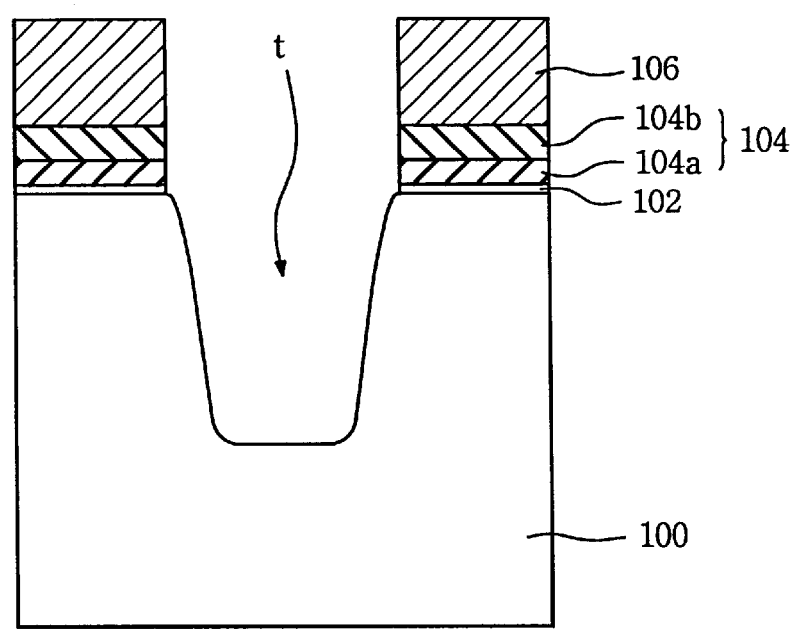

FIG. 8 depicts a photoresist film pattern (not shown) defining the field region being formed on the antioxidation film, and using the photoresist film pattern as a mask, antioxidation film 106, polysilicon film 104 and pad oxide film 102 are sequentially etched, so as to expose a surface of a portion of the substrate 100 to be used as the field region. Then, by using the photoresist film pattern as a mask, the exposed portion of the surface of substrate 100 is etched to a predetermined thickness to thereby form a trench t within substrate 100. Next, the photoresist film pattern is removed. This results in antioxidation film 106, polysilicon film 104, and pad oxide film 102 remaining only in the active region of the substrate 100. Unlike the process for forming the trench t according to the above method, the trench t may be formed also in a manner where antioxidation film 106 is etched by using the photoresist film pattern, and the photoresist film pattern is then removed. Thereafter, a lower film is etched by using the etched antioxidation film 106 as a mask.

Figure 9:
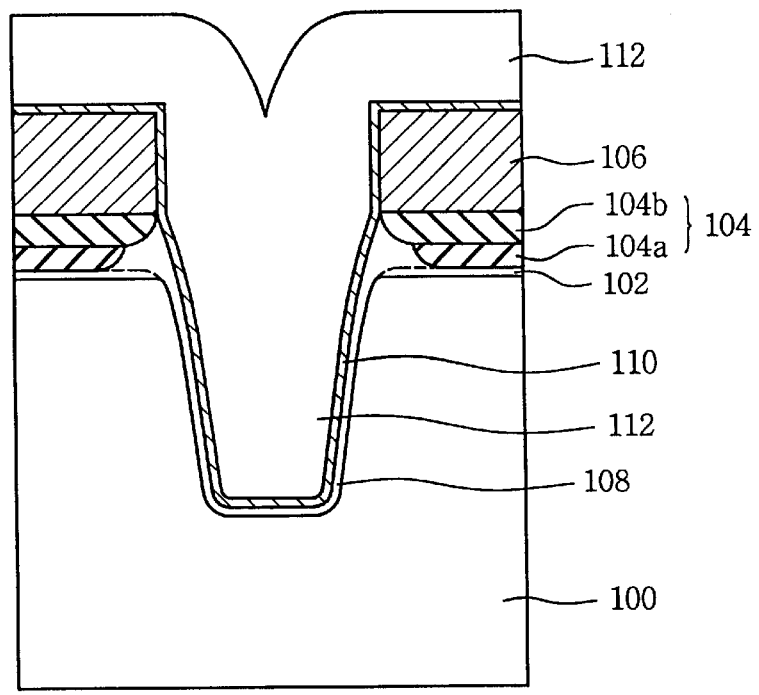

As shown in FIG. 9, in order to cure any damage in the etched surface of the silicon substrate caused during the process of forming trench t, first insulation film 108 made of a thermal oxide film material is formed along the internal face of trench t by an oxidation process. The upper end portion of the trench t (especially, the portion where doped polysilicon film 104a is formed) is made thicker than the other portion of trench t. The reason this happens is because the oxidation rate of doped polysilicon film 104a is faster than that of undoped polysilicon film 104b, and the oxidation rate of undoped polysilicon film 104b is faster than that of silicon substrate 100, according to which the layers 104a and 104b are oxidized.

Subsequently, a stress buffer film made of a SiN material (also called a nitride film liner) is formed on the entire surface of the resulting structure, and second insulation film 112 made of a CVD oxide film material is formed on stress buffer film 110. Second insulation film 112 also substantially fills trench t. The reason for forming stress buffer film 110 between first insulation film 108 and second insulation film 112 is to prevent a defect such as a dislocation from occurring within substrate 100 at the margin of the bottom of trench t due to stress caused during an annealing treatment or a follow-up oxidation process, each of which is performed to densify the film quality after the second insulation film 112 is deposited.

Figure 10:
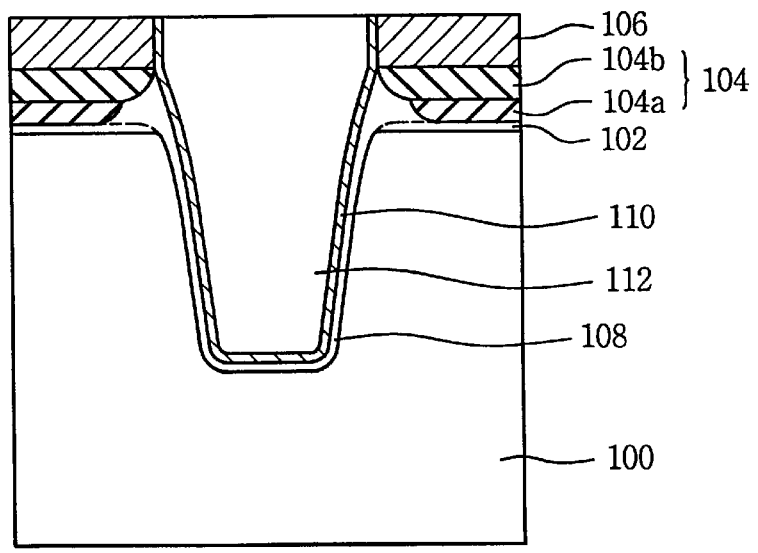

In FIG. 10, the second insulation film 112 is CMP-processed, in a manner such that antioxidation film 106 having a predetermined thickness (i.e., the thickness corresponding to 4/5~5/6T, assuming that the total thickness of the antioxidation film is T) remains, thereby making the entire substrate planar. During this process, the stress buffer film 110 is also partly etched.

Figure 11:
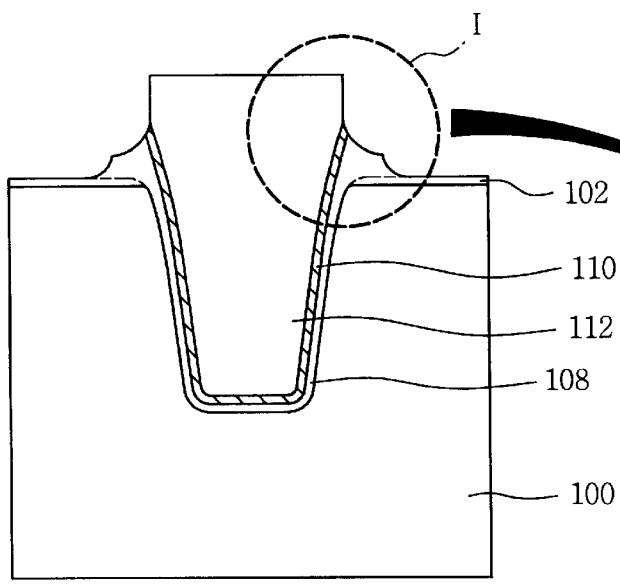

FIG. 11 illustrates antioxidation film 106 and the polysilicon film 104 remaining on the active region, with these two films being sequentially removed by using an isotropic etching process. Antioxidation film 106 is removed by a wet etching method using phosphoric acid as an etchant, while polysilicon film 104 is removed by a wet etching method using NH$_4$OH as an etchant, which has a desirable etching selection rate for second insulation film 112.

During this process, stress buffer film 110 is used as a nitride film liner and is also partly etched. Polysilicon film 104 having the dual structure and first insulation film 108 formed as the polysilicon layer, which is oxidized, underlie antioxidation film 106. Such a structure compensates for the height, which is as high as the thickness of polysilicon film 104, so that stress buffer film 110 would not be extensively etched to the side of the inner wall of trench t.

Figure 11A:
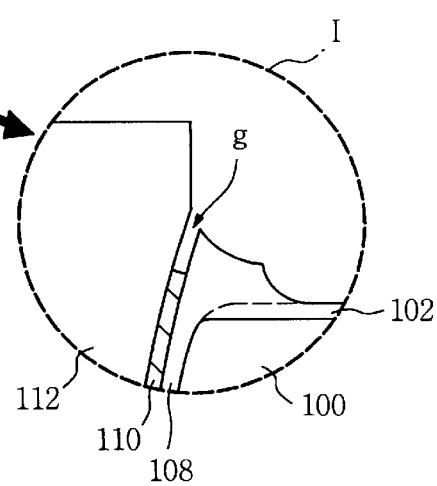

FIG. 11A illustrates an enlarged portion of I in FIG. 11, showing an etched degree of stress buffer film 110, where g represents a groove in a concave shape formed by etching stress buffer film 110. It is noted from the drawing that though the groove g is generated as the stress buffer film 110 is etched, groove g is formed at the upper end of trench t, rather than at the inner wall of the trench.

Figure 12:
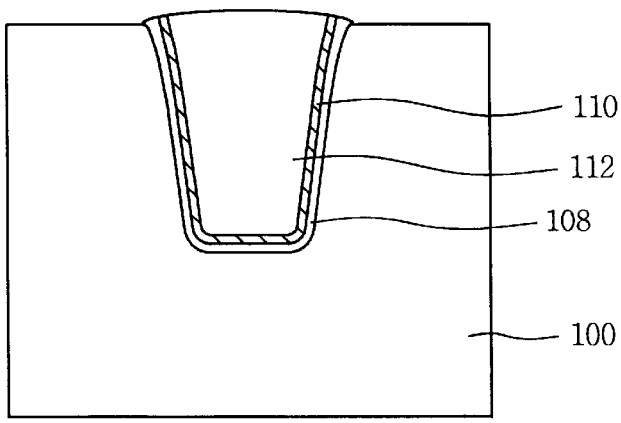

FIG. 12 shows pad oxide film 102 being removed by using a wet etching method to form a STI consisting of stress buffer film 110 and first and second insulation films 108 and 112. After a buffer oxide film (not shown) is formed on the active region of substrate 100, an ion-implantation process forming a well and an ion-implantation process adjusting the threshold voltage Vth are performed. Then, by removing the buffer oxide film, the element isolation process is completed.

Since second insulation film 112 of the field region is also partly etched during the process of removing pad oxide film 102 and the buffer oxide film, when the device isolation process is completed, the step coverage of the STI is leveled down to almost the same level as that of the active region.

In this respect, referring to the second insulation film, since the portion thereof formed as polysilicon film 104 is oxidized and has an etching speed slower than second insulation film 112 filling the trench t due to the film quality, it is etched slowly, so that there is no inferiority to be considered relating to etching. When the STI is formed according to the above described method, as shown in the portion of 'I' of FIG. 11, even though stress buffer film 110 is also partly removed when antioxidation film 106 remaining on the active region is removed, since the amount of etching does not reach the inner wall of trench t owing to polysilicon film 104 having the dual structure, the groove g is formed at the upper end portion of the trench, rather than the inner side wall thereof.

Accordingly, when a series of follow-up processes such as etching to remove pad oxide film 102 and depositing and removing the buffer oxide film are subsequently performed, even though the size of the groove g becomes greater as second insulation film 112 and first insulation film 108 in the vicinity of the groove g are also partly etched, since first and second insulation films 108 and 112 disposed at the upper portion of stress buffer film 110 are to be removed, there is no material effect to worry about.

Accordingly, the groove is restrained from occurring on the edge portion of the STI on the interface of the field region and the active region, thereby preventing a concentration of an electric field or hump phenomena when the device is driven. In this manner, the operational characteristics of the thus-formed transistor are greatly improved.

As described above, according to the preferred embodiment of the present invention, a polysilicon film having a dual structure of the doped polysilicon film and the undoped polysilicon film is formed between the antioxidation film, made of a nitride film material, and the pad oxide film thus forming the STI. Therefore, the groove formation portion is raised to the upper end portion of the trench, rather than being formed at the inner side wall, and for this reason, grooves are prevented from occurring at the edge portion of the shallow trench isolation. Moreover, degradation of the operational characteristics of the transistor due to the concentration of the electric field and the hump phenomena can be prevented.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Thus, the present invention has been described herein with reference to a particular embodiment for a particular application. Those having ordinary skill in the art and access to the present teachings will recognize additional modifications, applications, and embodiments within the scope thereof.

Accordingly, the invention is not to be considered as limited by the foregoing description, but rather is limited by only the scope of the appended claims.

What is claimed is:
1. A method for fabricating a semiconductor device, comprising the steps of:

sequentially forming a pad oxide film, a polysilicon film, and an antioxidation film on an active region of a semiconductor substrate such that a field region is exposed, wherein the polysilicon film is formed with a dual stacked structure of a doped polysilicon film and an undoped polysilicon film;

etching an exposed portion of the surface of the substrate to a predetermined thickness to form a trench within the substrate;

forming a first insulation film along an inner face of the trench by using an oxidation process to form a resultant structure;

forming a stress buffer film on the entire surface of the resultant structure;

forming a second insulation film on the stress buffer film such that the trench is substantially filled;

making planar the second insulation film such that the antioxidation film remains with a predetermined thickness on the active region of the substrate so as to form a shallow trench isolation within the trench; and sequentially removing the remaining antioxidation film, the polysilicon film, and the pad oxide film.

2. The method according to claim 1, wherein the step of sequentially forming includes the step of forming the antioxidation film in one of a single layer structure of SiN and a stacked structure of SiN/SiON.

3. The method according to claim 1, wherein the step of forming the stress buffer film includes the step of forming the film of SiN.

4. The method according to claim 1, wherein the doped polysilicon film is formed with a thickness of 300~700 Å.

5. The method according to claim 1, wherein the undoped polysilicon film is formed with a thickness of 300~700 Å.

6. The method according to claim 1, wherein the step of making planar the second insulation film includes using a CMP process such that the antioxidation film remains with a thickness of $\frac{1}{5}$~$\frac{5}{6}$T, where T represents a total thickness of the antioxidation film on the active region of the substrate.

7. The method according to claim 6, wherein the thickness "T" is in the range of 1000~2000 Å.

8. The method according to claim 1, wherein the step of sequentially removing includes removing the antioxidation film using a wet etching method with phosphoric acid as an etchant.

9. The method according to claim 1, wherein the step of sequentially removing includes removing the polysilicon film using a wet etching method with $NH_4OH$ as an etchant.

* * * * *